United States Patent [19]

Yamazaki

[11] Patent Number: 4,960,751
[45] Date of Patent: Oct. 2, 1990

[54] ELECTRIC CIRCUIT HAVING SUPERCONDUCTING MULTILAYERED STRUCTURE AND MANUFACTURING METHOD FOR SAME

[75] Inventor: Shumpei Yamazaki, Tokyo, Japan

[73] Assignee: Semiconductor Energy Laboratory Co., Ltd., Atsugi, Japan

[21] Appl. No.: 174,790

[22] Filed: Mar. 29, 1988

[30] Foreign Application Priority Data

Apr. 1, 1987 [JP] Japan .................. 62-81487
Feb. 1, 1988 [JP] Japan .................. 63-22384

[51] Int. Cl.$^5$ ............................. H05K 1/00
[52] U.S. Cl. ........................ 505/1; 174/257; 428/195; 428/245; 428/930; 505/703; 427/62
[58] Field of Search ............ 174/68.5, 125.1, 257; 505/833, 884, 887, 917, 923, 1, 703; 428/195, 245, 930; 427/62

[56] References Cited

U.S. PATENT DOCUMENTS

| | | | |
|---|---|---|---|
| H39 | 3/1986 | Gubser et al. | 427/62 X |
| 3,352,008 | 11/1967 | Fairbanks | 505/884 X |
| 3,432,783 | 3/1969 | Britton et al. | 505/884 X |
| 3,912,611 | 10/1975 | Royer et al. | 174/68.5 X |
| 3,997,714 | 12/1976 | Letellier et al. | 174/125.1 X |
| 4,470,190 | 9/1984 | Fulton et al. | 437/22 |
| 4,481,229 | 11/1984 | Suzuki et al. | 427/38 |
| 4,624,737 | 11/1986 | Shimbo | 437/189 X |

FOREIGN PATENT DOCUMENTS 0164278 9/1983 Japan.

OTHER PUBLICATIONS

Chien, C. L. et al., Effect of Noble Metal Buffer Layers on Superconducting $YBa_2Cu_3O_7$ Thin Films; Appl. Phys. Lett. 51(25), 21 Dec. 87; p. 2155.

Meyer, H. M., III et al., Spectroscopic Evidence for Passivation of the $La_{1.85}Sr_{0.15}CuO_4$ Surface with Gold; Appl. Phys. Lett., vol. 51 (No. 14), 5 Oct. 87, p. 1119.

Koinuma, Hideomi et al.; Chemical Interaction between $Ba_2YCu_3O_{7-\delta}$ and Substrate Materials in the Solid State; Japanese Journal of Applied Physics; vol. 27, No. 7, Jul. 88, pp. L1216–L1218.

*Primary Examiner*—Morris H. Nimmo
*Attorney, Agent, or Firm*—Sixbey, Friedman, Leedom & Ferguson

[57] ABSTRACT

An electric circuit is provided on a semiconductor substrate with a superconducting film. The surfaces being in contact with the superconducting film are made of heat-resistant non-oxide insulating materials so that the performance of the superconducting film is not degraded.

5 Claims, 6 Drawing Sheets

ELECTRIC CIRCUIT HAVING SUPERCONDUCTING MULTILAYERED STRUCTURE AND MANUFACTURING METHOD FOR SAME

BACKGROUND OF THE INVENTION

This invention relates to an electric circuit having superconducting multilayered structure and manufacturing for same.

Conventionally, a wire rod of a Nb-Ge metallic material (for example, $Nb_3Ge$) and the like is used as a superconducing material. Superconducting magnets have been manufactured only with such conventional conventional type wire.

In addition, in recent years ceramic materials wich exhibits superconducting properties are known. However, these are also in ingot form and as yet there has been no development of superconducting materials in thin film form.

Methods by which thin film is produced by patterning, using photolithgrphy, and the use of this thin film as one part of the connecting wiring of a semiconductor device are also completely unknown.

On the other hand, semiconductor devices provided with a plurality of the elements containing semiconductor integrated circuits within the same substrate are known.

The development of more and more refined semiconductor integrated circuits with high speed action has in recent years become a necessity. Also, along with this refinement a drop in reliability from the heat generated in the semiconductor element and also a reduction in activation speed in the heated parts have become a problem. For this reason, it has been earnestly required to obtain improved structure which less influence the characteristics of superconducting ceramics.

SUMMARY OF THE INVENTION

It is therefore an object of the invention to provide an improved electric circuit having a superconducting multilayered structure.

It is another object of the invention to provide an improved electric circuit having a superconducting multilayered structure with maximum performance.

In accordance with one aspect of the invention, a carbon film is formed in contact with a superconducting ceramic in the form of thin film, ingot, strap, strip, wire or the like. The carbon film is deposited on a substrate by decomposition of a carbon compound gas maintained, e.g. at 0.01 to 0.5 Torr by virtue of a plasma reaction supplied with a DC or AC electric power. C—C and C=C bonds can be broken by a high frequency power of 0.1 MHz to 50 MHz, e.g. 13.56 MHz. Further, C—H bonds can be broken by a high frequency power of 1 GHz or higher. By this process, the carbon film becomes rich in C—C or —C—C— bonds with hybrid orbital $PS^3$, and therefore becomes a diamond-like carbon having an energy gap of not lower than 1.0 eV, preferably 1.5 to 5.5 eV, rather than graphite which is opaque and can not be used as a reliable insulating material.

In representative cases, superconducting ceramics for use in accordance with the present invention may be prepared consistent with the stoichiometric formula $(A_{1-x}B_x)_y Cu_z O_w$, where A is one or more elements of Groups IIIa, IIIb, Va and Vb of the Priodic Table, B is one or more elements of Group IIa of the Periodic Table, e.g., the alkaline earth metals including beryllium and magnesiu, and $x=0.3-1$; $y=2.0-4.0$; $z=1.5-3.5$, and $w=4.0-10.0$. Examples of this general formula are $BiSrCaCu_{2-3}O_{4-10}$, $Y_{0.5}Bi_{0.5}Sr_1Ca_1Cu_{2-3}O_{4-10}$, $YBa_2Cu_3O_{6-8}$, $Bi_1Sr_1Mg_{0.5}Ca_{0.5}Cu_{2-3}O_{4-10}$, $Bi_{0.5}Al_{0.5}SrCaCu_{2-3}O_{4-10}$. These material can be formed on a surface by electron beam evaporation, sputtering, photoenhanced CVD, photo-enhanced PVD, and so forth.

BRIEF DESCRIPTION OF THE INVENTION

DETAILED DESCRIPTION OF THE PREFERRED EMBODIMENTS

Referring to FIGS. 1(A) to 1(D), the steps in the production of a first embodiment of the semiconductor device in accordance with the present invention is shown.

The semiconductor device is comprised of a semiconductor substrate which is desirably heat resistant, for example, a single crystalline silicon semiconductor substrate and a plurality of elements provided within this semiconductor substrate such as an insulated gate effect transistor. Then, a superconducting material with zero electrical resistance is formed on this substrate or on the upper surface of the insulating film or on the conductor. This superconducting material is selectively etched, and patterning is performed by photolithograpy. In addition, the crystalline structure of the ceramic material is improved by heat annealing at 500°-1000° C., particularly in an oxidizing atmosphere either before or after this step, so that superconductivity is exhibited at extremely low temperatures. By repeating this process once or several times, one layer or several layers of connecting wiring are formed of a material with zero electrical resistance at a temperature lower than a certain critical level.

Now referring to FIG. 1(A), an insulating film 2 is formed on a silicon simiconductor substrate 1 and openings 8 are formed of the insulating film 2 by photolithography.

Figure 1:
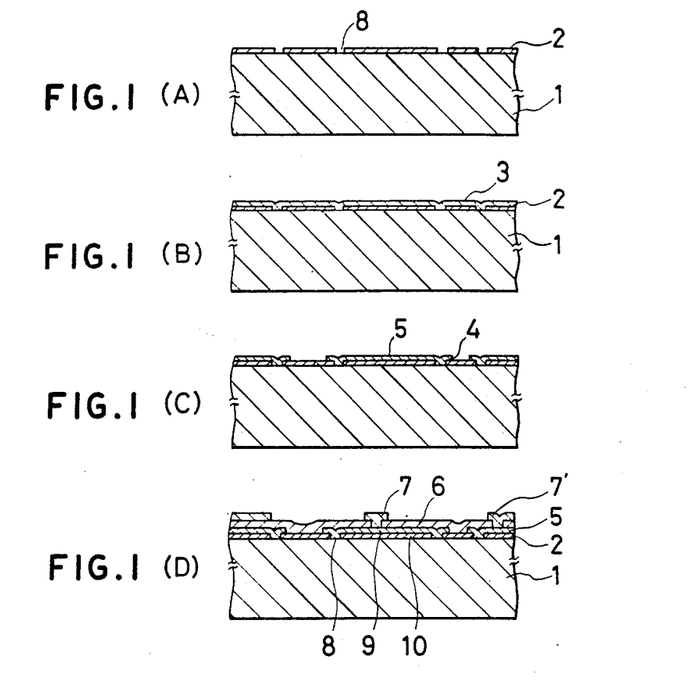
FIGS. 1(A) to 1(D) are cross sectional views showing the manufacturing process of a first embodiment of the present invention.

Inside of the semiconductor substrate 1, there are previously provided an insulated gate field effect transistor (IGFET) (not shown in FIG. 1), an active element such as a bipolar transistor or a resistance (not shown in FIG. 1), and a passive element such as a capacitor (not shown in FIG. 1). Then a contact section for an electrode of the active element or the passive element is provided to correspond to the opening 8.

The insulating film 2 is made of a multilayer comprising an underlying silicon oxide film and an overlying silicon nitride film which provides a heat-resistant non-oxide upper surface for the insulating layer. It is important that the insulating material does not interact nor make an mixture with a superconductor which is to cover it during firing. Instead of silicon nitride, other nitrides such as AlN and TiN or carbon compounds such as SiC and TiC are suitable as heat-resistant non-oxide materials. In this insulating film are provided a number of contact areas at which the underlying substrate is exposed.

In FIG. 1(B), a material which exhibits superconductivity is formed in the form of thin film on the upper surface of these elements and the substrate. The thin film is formed by sputtering method in this embodiment. However, the screen printing method, vacuum evaporating method, or chemical vapor deposition method (CVD method) may also be used. Nonetheless, the sputtering method used here is suitable for mass production, and easily produces a ceramic thin film which is heat resistant.

Representative superconducting materials used in the present invention are oxide ceramics using elements in Group IIIa and IIa of the Periodic Table and copper.

In the sputtering device, the target is made of the material conforming to the composition $(Y_{1-x}Ba_x)_yCu_zO_w$, where $0<x<$, $y=2-4$, $z=1.5-3.5$, $w=4-10$, such as $(YBa_2)Cu_3O_{6-8}$. Sputtering for this embodiment is effected at a substrate temperature of 450° C., in an argon atmosphere, with an input power at a frequency of 50 Hz and output of 100 W. The thin film of ceramic material in this case is 0.2 micron meter to 2 micron meters in thickness, for example, a thickness of 1 micron. The ceramic material is then annealed under oxgen at 700° C. for 10 hours. After that it is possible to create the superconducting thin film at Tc onset=95° K. The resistivity begins to sharply drop below 95° K., and experimentally the resistance was practically zero at 79° K.

After this, to produce the electrodes and leads for the connecting wiring containing the connecting for the electrode of the elements and the input and output terminals, the upper surface of the structure is photoresist coated for the required configuration. Selective removal is performed by wet etching using acid, for example, suphuric or nitric acid or by dry etching using $CCl_4$ or $CBr_4$ to obtain the semiconductor device of FIG. 1(C). In this way, the prescribed patterning is carried out on the thin film 3 using photolithography. This patterning can be carried out just after the formation of the superconducting film, followed by heat annealing, so that only the patterned connecting operating section can be selectively crystallized.

In this case, because the crystal sizes are small even in the initial status, a smaller pattern is possible in the connecting wiring.

FIG. 1(D) shows the required multilayered wiring formed after the above process. In particular, the aluminum metal has a better connecting property than the ceramic superconductor to connect outside lead to the semiconductor device. For this reason, while the insulating film 6 betwen the layers is formed of oxidized silicon, polyimide resin (PIQ), the patterns 7 and 7' are formed of aluminium.

Specifically, in the present invention, the one layer or multiple layers of the connecting wiring of the elements are formed from the superconducting ceramic. In addition, the electrode which is drawn outside is provided with metal pads for better bonding property of the material. Of course, the pad section may also be made of the superconducting material if the bonding property of the material with the outside can be improved.

Figure 2:
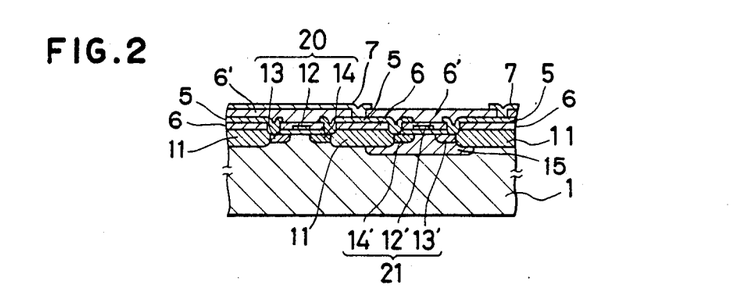
FIG. 2 is a cross sectional view showing a second embodiment of the present invention.

FIG. 2 shows another embodiment of the present invention, specifically, a C/MOS (complementary IGFET) section only.

The section has a silicon semiconductor substrate 1 with adequate durability from annealing. Further, a p-type well 15 is formed within the substrate, and silicon oxide 11 in the form of a field insulating film is provided thereon. One IGFET 20 provided with a field insulating film 11, a gate electrode 12, a source 13, and a drain 14 as a p-channel IGFET. Another IGFET is provided with a gate electrode 12'. a source 13', and a drain 14', as an n-channel IGFET. The gate electrodes 12 and 12' are polycrystalline silicon, and the wiring connections between the gate electrodes 12 and 12' and the other wirings 5 and 7 are formed of the superconducting material 5 as in the forgoing embodiment. This superconducting material is made by CVD method. In the case where no damage is imparted to the lower substrate, the gate electrodes may be formed of the superconducting material. Like the foregoing embodiment, the insulating film 6 underlying below the superconducting ceramic film and covering the gate electrode is made of a heat-resistant non-oxide material such as silicon nitride or silicon carbide. The other insulating film 6' contacting the upper surface of the superconducting film 5 is made also of a heat-resistant non-oxide film making contact with the other superconducting film 7.

When this kind of semiconductor is cooled to the liquid nitrogen temperature, the mobility of the carrier can be increased 3 or 4 times. In addition, it becomes possible to reduce the electrical resistance of the lead wires and electrodes to zero. For this reason, extremely high speed action becomes possible. In the light of the nitride in accordance with the present invention, it is also possible to provide a high temperature superconducting ceramic film of a thickness of 30 microns or less, e.g. 0.1 to 1 micron.

In the present invention, the semiconductor is not necessarily made of silicon, but may be a semicoductor compound of GaAs and the like obtained by heteroepitaxial growth on a silicon semiconductor for use as a semiconductor film, In this case, however, it is necessary to take procedure to lower the annealing temperature so that the semiconductor substrate does not suffer from heat during annealing.

Hereinbelow, examples in which carbon films are used to be in contact with superconducting ceramics. First, a process for depositing a carbon film on a substrate such as a glass, semiconductor, ceramic substrate is described in conjunction with FIG. 3. The substrate may be provided with a superconducting pattern, built-in semiconductor circuitry and so on. In this description, although carbon deposition may be performed also in the form of clusters or other forms instead of film form, depending on the case, all the carbon depositions are called simply film for convenience hereinafter.

Figure 3:
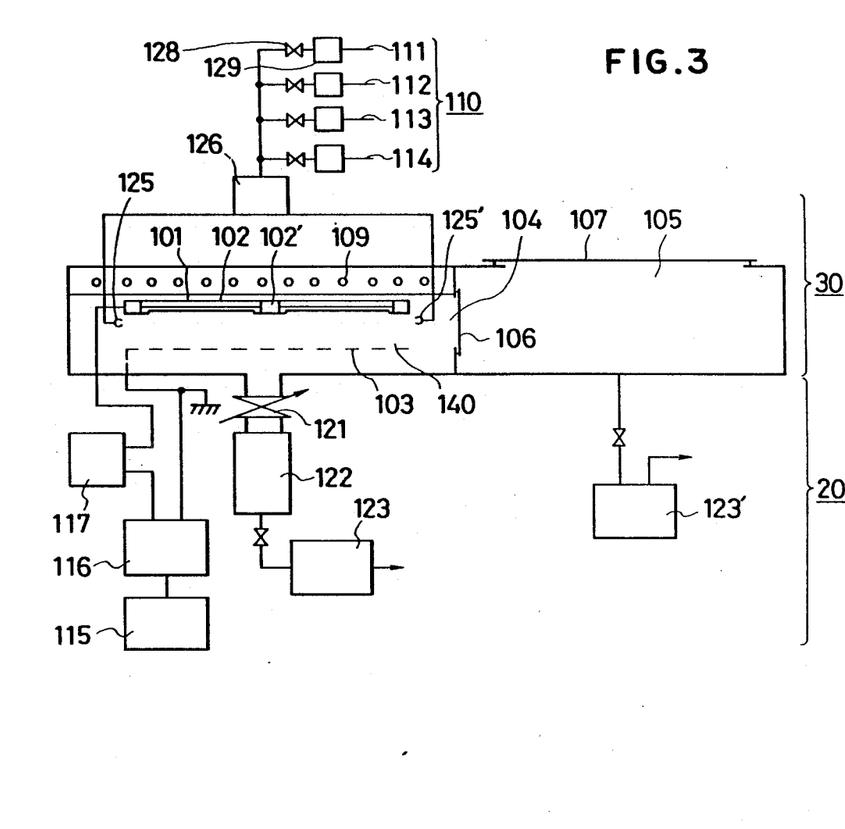
FIG. 3 is a cross sectional view showing a manufacturing device in accordance with invention.

FIG. 3 is a cross sectional schematic view showing a plasma enhanced chemical reaction apparatus for use of deposition and etching in accordance with the present invention. The apparatus comprises a reaction chamber 104, a loading-unloading chamber 105, a gas feeding system 110, a high frequency power source 115 associated with a matching transfomer 116, a rotary pump 123 connected to the reaction chamber 104 through a turbo molecular pump 122 and valve 21, and a rotary pump 123' connected to the loading-unloading chamber 105. The reaction chamber 104 is provided with a heater 109 to maintain the substrate temperature at an appropriate level during process.

Substrates 110 to be coated with carbon are transported from the loading chamber 104 to the reaction chamber 105 through a gate valve 106, each chambers being evacuated to a predetermined negative pressure in advance. After evacuating the reaction chamber 104 further if necessary with the gate valve closed, a carbon compound gas such as $CH_4$ or $C_2H_4$ and hydrogen gas are inputted to the reaction chamber 104 respectively from inlet ports 112 and 111 through flow meters 129, valves 128 and a microwave excitation means 125. The outlet is a pair of ports 125 and 125' between which is located a substrate holder 102 functioning also as a first electrode. The flow rates of the carbon compound gas and hydrogen gas are equal and controlled so that the pressure of the reactive gas in the reaction chamber is maintained at 0.001 Torr to 10 Torr, preferably 0.01 Torr to 1 Torr, e.g. 0.1 Torr during deposition. The substrate temperature is $-100°$ C. to $+150°$ C. In this condition, a high frequency electric power of 50 W to 1 KW is applied between the first electrode 102 and a counterpart second electrode 103 from the power source 115. The power is biassed through a DC source 117 by $-200$ V to $+600$ V. The electric power to the reaction space corresponds substantially to a voltage application alternating between $-400$ V to $+400$ V, since in absence of the bias voltage a self-bias of $-200$ V appears between the first electrode 102 and the second electrode 103 earthed. When the reactive gas ($CH_4+H_2$, for example) is energized in advance of the entrance to the reaction space by microwave excitation caused by a microwave (2.45 GHz) emitted by the excitation means 125, the deposition speed can be increased by a factor of 5. In case of etching, the etching speed can be increased by a factor of 4 by the microwave excitation of etchant gas in advance of introduction to the reaction chamber 104.

By virtue of the electric power which is equivalent to 0.03 to 3 W/cm$^2$, the reaction gas is put in a plasma state 140 and a carbon film is deposited on the substrates 101 at a growth rate of 100–1000 Å/min. The vickers hardness of the carbon film is not lower than 2000 Kg/mm$^2$ and the thermal conductivity is not lower than 2.5 W/cm deg, preferably 4.0 to 6.0 W/cm deg. The carbon film has microcrystalline or amorphous structure containing a large number of C—C bonds therein. We call such a very hard amorphous carbon "diamond-like carbon" or DLC for short. Of course, diamond can be formed by adjusting the deposition condition.

According to experimental, the growth rates on substrates maintained at $-50°$ C. to 150° C. were 100–200 Å/min with $CH_4$ as the carbon compound and a DC bias voltage of $+100$ V to $+300$ V but no microwave excitation, 500–1000 Å/min with $CH_4$ or $C_2H_4$ or $C_2H_4$ and a microwave excitation. Only samples having a thermal conductivity not lower than 2.5 W/cm deg were acceptable. An unnecessary exhausted gas of the reaction was removed by the turbo molecular pump 122 and the rotary pump 123.

Figure 4A:
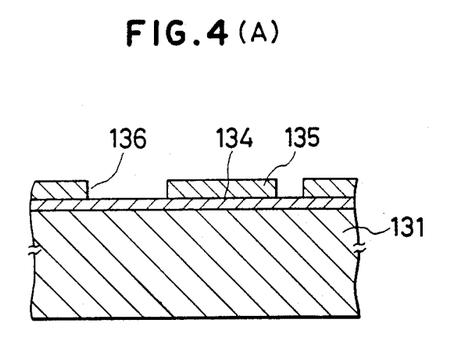
FIGS. 4(A) and 4(B) are corss sectional view showing the manufacturing process of a third embodiment of the present invention.
Figure 4B:
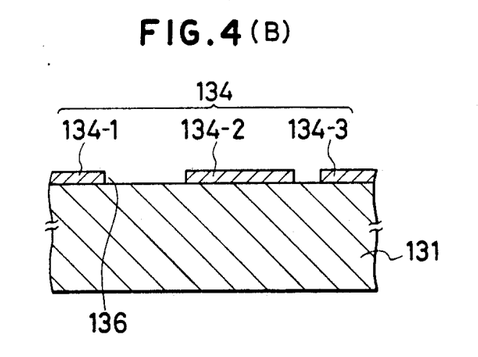

Next, an etching process for patterning a carbon film deposited as explained above will be described. In FIG. 4(A), a mask 135 is formed on a carbon film 134 which is in turn deposited on a substrate 131. The mask may be made of insulating material such as silicon oxide, a photoresist and silicon nitride. The substrate 131 is disposed in the reaction chamber 104 in the same way as deposition explained supra. Then, oxygen is inputted from the inlet port 110 and a 300 W high frequency power is inputted thereto at 0.01 Torr to 1 Torr, e.g. 0.1 Torr. According to experimental, the etching speed was measured to be 350 Å/min. The etching speed was decreased to 270 Å/min when the pressure was 0.5 Torr. As a result, a portion of the carbon film 134 which is free of the mask 135 is removed by this etching. After removing the mask 135, a carbon pattern 134 is obtained as illustrated in FIG. 4 (B). Atmospheric air, $NO_4$, $NO_2$, $N_2O$, the mixture of oxygen and hydrogen and a gaseous oxide compound such as water may be used instead of oxygen in this process. Also, a fluorine compound gas can be used as the etchant gas, e.g. $CF_4$ and $NF_3$.

The chemical reaction apparatus can be used also to deposit silicon nitride films and to pattern the same by etching. The reactive gas for deposition is composed of ammonia and silane for example, and the etchant gas is $NF_3$, $SF_6$ or $CF_3$.

Figure 5:
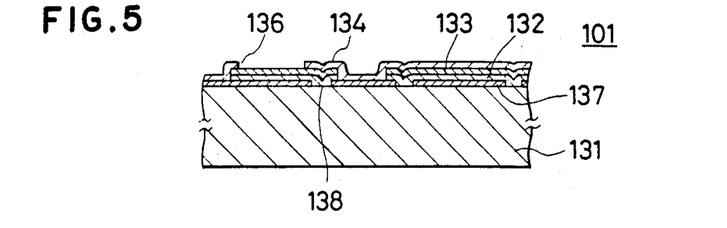
FIG. 5 is a cross sectional view showing a fourth embodiment of the present invention.

FIG. 5 is a cross section view showing a third embodiment of the present invention to show carbon deposition on a semiconductor integrated circuit formed on a substrate 131. The semiconductor device comprises a silicon oxide insulating film 137, a metallic pattern 132, a superconducting ceramic film 133 and a carbon film 134 with 0.1 to 2 micron, e.g. 0.5 micron in thickness deposited in accordance with the present invention. In this case, bonding pads and electical wiring for making connection with external circuitry are made of alminium, a metal silicide or silicon doped with an impurity, and conductor for this purpose is made of selected from materials which are not transformed into insulating material by oxidizing, such as copper, silver, gold and platinum. The bonding pads and electrical wiring can be made of a portion of the superconducting film 133. Then, openings 136 can be formed without deteriorating the superconducting film 133 to provide pads for bonding. With this construction, in the light of the high thermal conductivity of the carbon film, the superconducting film can be prevented, during operation, from being transformed to its normal conductivity due to heat produced by such as a power transistor.

Figure 6:
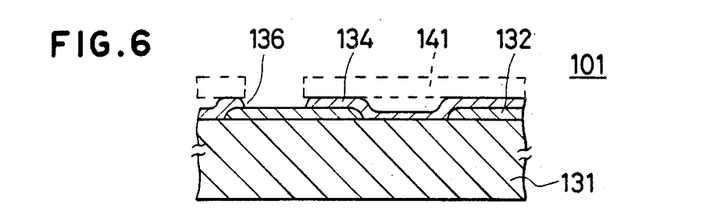
FIG. 6 is a cross sectional view showing a fifth embodiment of the present invention.

Referring to FIG. 6, a fourth embodiment is illustrated. In the figure, an superconducting ceramic device comprises a substrate 131 made of a glass or a grazed ceramic, an electrical wiring made of a superconducting oxide ceramic 132 patterned by etching, and a 0.2–2 micron carbon film. An opening 136 of the carbon film 134 is formed by forming a 50–500 microns metallic mask 141 such as a stainless film on the upper surface, and etching the exposed carbon film at the opening 136 using a fluorine compound gas as an etchant. On the upper surface of the carbon film 132, a further circuit may be formed in the same way as in foregoing.

Figure 7:
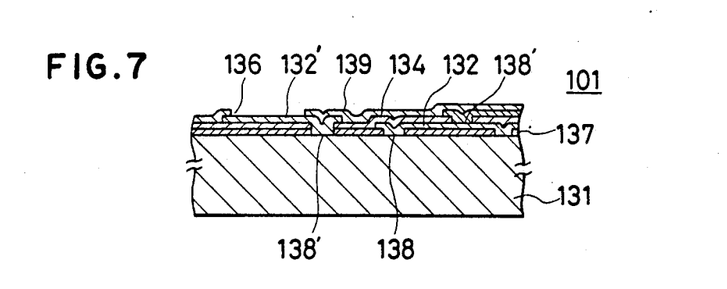
FIG. 7 is a cross sectional view showing a sixth embodiment of the present invention.

Referring to FIG. 7, a fifth embodiment is illustrated. This embodiment has a similar structure of the device shown in FIG. 5. An insulating film pattern 137 is formed on a substrate 131 with openings 138 and 138'. Over the insulating film 137 is formed a superconducting film 132 followed by patterning thereof. A carbon film 134 is deposited over the superconducting film 132 and the insulating film 137 and patterned by etching in the same way as explained in conjunction with FIG. 3 to produce openings 138' and 138''. Another superconducting ceramic film 132' is deposited by sputtering on these films already formed, and is contacted with the substrate 131 through the opening 138' and the underlying superconducting film 132 through the opening 138". Finally, another carbon film 139 (or other passivation film) is overlaid and patterned to produce a bonding pad 136 for the superconducting wiring 132'. The superconducting film may be enclosed by carbon films at the upper and lower surfaces to prevent contact with other insulating film.

Carbon employed for the devices in accordance with the present invention may contain hydrogen and/or halogen at not higher than 25 atom %, a trivalent or pentavalent impurity at not higher than 5 atom %, or nitrogen at $N/C \leq 0.05$.

Although, in the above description, a semiconductor substrate provided with active devices therein, a cramic substrate coated with a non-oxide film such as a 50 to 5000 Å thick silicon nitride on its upper surface may be used. For example a YSZ (yttrium stabilized zircon) substrate is used instead which has a coefficient of thermal expansion substantially same as the ceramic.

Figure 8:
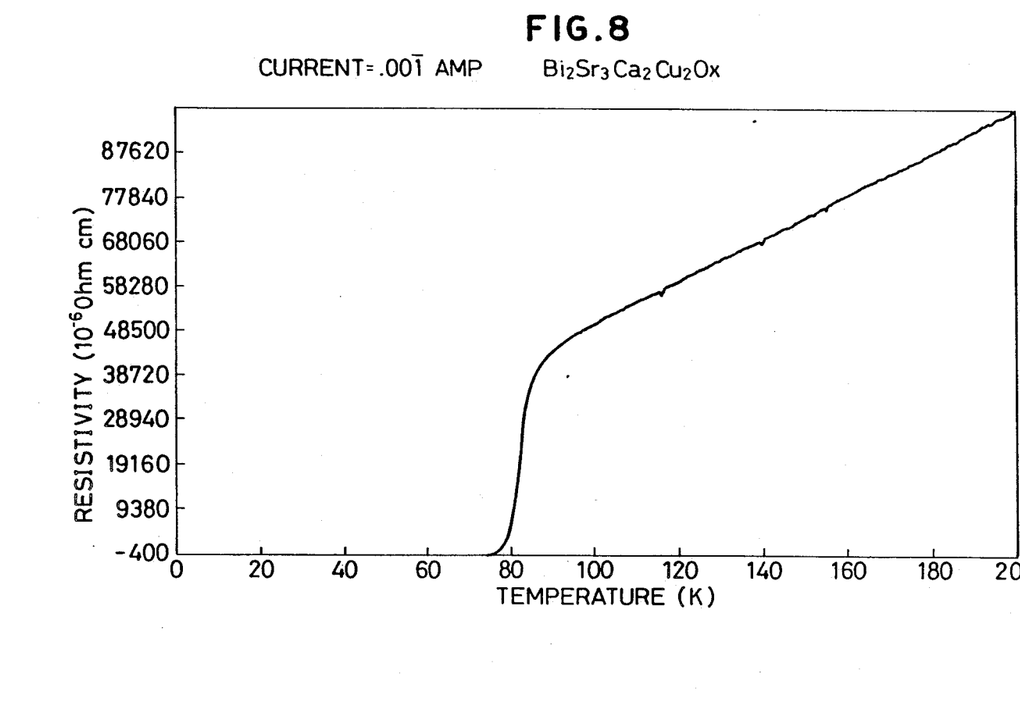
FIGS. 8 and 9 are graphical diagrams showing the relationship between the resistivity and the temperature of superconducting ceramics.
Figure 9:
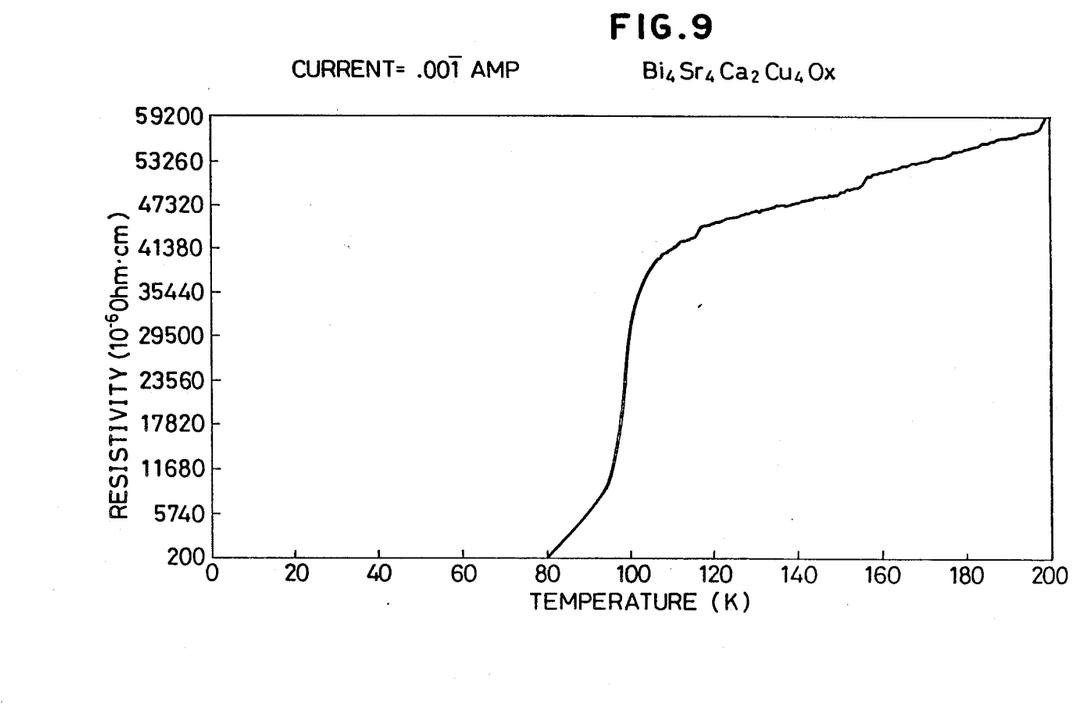

Superconducting ceramics for use in accordance with the present invention also may be prepared in consistence with the stoichiometric formulae $(A_{1-x}B_x)_yCu_zO_w$, where A is one or more elements of Group IIIa of the Priodic Table, e.g., the rare earth elements, B is one or more elements of Group IIa of the Periodic Table, e.g., the alkaline earth metals including beryllium and magnesium, and $x=0-1$; $y=2.0-4.0$, preferably 2.5-3.5; $z=1.0-4.0$, preferably 1.5-3.5; and $w=4.0-10.0$, preferably 6.0-8.0. One example is $YBa_2Cu_3O_{6-8}$. Also, superconducting ceramics for use in accordance with the present invention may be prepared consistent with the stoichiometric formulae $(A_{1-x}B_x)_yCu_zO_w$, where A is one or more elements of Group Vb of the Priodic Table such as Bi, Sb and As, B is one or more elements of Group IIa of the Periodic Table, e.g., the alkaline earth metals including beryllium and magnesium, and $x=0.3-1$; $y=2.0-4.0$, preferably 2.5-3.5; $z=1.0-4.0$, preferably 1.5-3.5; and $w=4.0-10.0$, preferably 6.0-8.0. Examples of this general formula are $BiSrCaCuCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40°-60° K., which is not so high. Relatively high critical temperatuers were obtained with samples conforming to the stoichiometric formulae $Bi_4Sr_4Ca_2Cu_4O_x$ and $Bi_2Sr_3Ca_2Cu_2O_x$. FIGS. 7 and 8 are graphical diagrams showing the relationship between the resistivity and the temperature for both samples. The number designating the oxygen propotion is 6-10, e.g. around 8.1.

While a description has been made for several embodiments, the present invention should be limited only by the appended claims and should not be limited by the particular examples.

I claim:

1. A superconducting pattern formed on a substrate coated with an insulating film made of an oxide, characterized in that said pattern is made of a copper oxide superconducting ceramic comprising rare earth and alkaline earth elements and that said pattern is prevented by an intervening non-oxide film, selected from the group comprising silicon nitride, aluminum nitride, titanium nitride, silicon carbide, titanium carbide, diamond-like carbon and diamond from being in direct contact with said insulating film.

2. The superconducting pattern of claim 1 wherein said substrate is a ceramic substrate.

3. The superconducting pattern of claim 2 wherein said superconducting pattern is directly formed on said substrate.

4. The pattern of claim 1 wherein said substrate is a semiconductor substrate.

5. The pattern of claim 4 wherein said semiconductor substrate contains a semiconductor device.

* * * * *